United States Patent
Lim

(10) Patent No.: US 9,660,160 B2
(45) Date of Patent: May 23, 2017

(54) LIGHT EMITTING DEVICE

(71) Applicant: LG INNOTEK CO., LTD., Seoul (KR)

(72) Inventor: Dong Wook Lim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/056,211

(22) Filed: Oct. 17, 2013

(65) Prior Publication Data

US 2014/0110742 A1 Apr. 24, 2014

(30) Foreign Application Priority Data

Oct. 18, 2012 (KR) .................. 10-2012-0115802

(51) Int. Cl.
*H01L 33/62* (2010.01)
*H01L 33/38* (2010.01)

(52) U.S. Cl.
CPC ............ *H01L 33/62* (2013.01); *H01L 33/382* (2013.01); *H01L 2924/0002* (2013.01)

(58) Field of Classification Search
CPC ....... H01L 33/40; H01L 33/382; H01L 33/38; H01L 33/387
See application file for complete search history.

(56) References Cited

U.S. PATENT DOCUMENTS

| | | | |
|---|---|---|---|
| 6,201,265 B1* | 3/2001 | Teraguchi | 257/99 |
| 7,233,028 B2* | 6/2007 | Weeks | H01L 29/0657 257/622 |
| 7,842,958 B1* | 11/2010 | Sekine | H01L 33/382 257/88 |
| 8,198,107 B2* | 6/2012 | Wu et al. | 438/26 |
| 2002/0117681 A1 | 8/2002 | Weeks et al. | |
| 2007/0080352 A1* | 4/2007 | Wu et al. | 257/79 |
| 2008/0029761 A1* | 2/2008 | Peng | H01L 33/486 257/43 |
| 2011/0012164 A1* | 1/2011 | Kim | 257/99 |
| 2011/0198609 A1 | 8/2011 | Huang | |
| 2011/0204403 A1 | 8/2011 | Kim et al. | |

(Continued)

FOREIGN PATENT DOCUMENTS

| CN | 102201428 A | 9/2011 |
|---|---|---|
| CN | 102222747 A | 10/2011 |

OTHER PUBLICATIONS

Dimitriadis C. A. et al., 'Contacts of titanium nitride to n- and p-type gallium nitride films,' 1999 Solid-State Electronics, vol. 43 pp. 1969-1972.*

(Continued)

*Primary Examiner* — Bryan Junge
(74) *Attorney, Agent, or Firm* — Ked & Associates LLP

(57) ABSTRACT

A light emitting device package, and a lighting system includes a light emitting device. The light emitting device includes a substrate, a first conductive semiconductor layer on the substrate, an active layer on the first conductive semiconductor layer, and a second conductive semiconductor layer on the active layer. A first via electrode contacts the first conductive semiconductor layer through a via hole formed through the substrate, and a second via electrode contacts the second conductive semiconductor layer through a second via hole formed through the substrate, the first conductive semiconductor layer, and the active layer.

20 Claims, 7 Drawing Sheets

(56) References Cited

U.S. PATENT DOCUMENTS

2011/0233575 A1* 9/2011 Huang et al. .................. 257/89
2012/0241718 A1   9/2012 Chen et al.
2012/0286317 A1* 11/2012 Yeh ........................ H01L 33/38
                                                              257/99

OTHER PUBLICATIONS

Jeyachandran Y. L. et al., 'Properties of titanium nitride films prepared by direct current magnetron sputtering,' 2007 Materials Science and Engineering A, vol. 445-446, pp. 223-236.*
European Search Report dated Oct. 15, 2015 issued in Application No. 13189140.0.

* cited by examiner

LIGHT EMITTING DEVICE

CROSS-REFERENCE TO RELATED APPLICATION

This application claims under 35 U.S.C. §119 to Korean Patent Application No. 10-2012-0115802 filed Oct. 18, 2012, which is hereby incorporated by reference in its entirety.

BACKGROUND

The embodiment relates to a light emitting device, a method of manufacturing the same, a light emitting device package, and a lighting system.

A light emitting device (LED) includes a P-N junction diode having a characteristic of converting electric energy into light energy. The P-N junction diode can be created by using compound semiconductors including group III-V elements in the periodic table. The light emitting device can represent various colors by adjusting the compositional ratio of the compound semiconductors.

LEDs according to the related art may be classified into lateral-type LEDs and vertical-type LEDs according to the position of an electrode layer.

Meanwhile, according to an LED packaging technology of the related art, a flip-chip LED is based on a lateral-type LED, and a hole injection semiconductor layer and an active layer are etched to form an N type electrode. Accordingly, a light emitting area may be narrowed so that luminous flux may be reduced.

In addition, since the flip-chip LED according to the related art is based on the lateral-type LED, the flow of carriers is not spread so that current is concentrated, which lowers light emission efficiency.

Further, the flip-chip LED according to the related art employs an electrode representing a low optical transmittance rate, and allows the electrode to reflect light so that the light is extracted through a sapphire substrate, so light extraction efficiency may be lowered The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Hereinafter, a light emitting device, a light emitting device package, and a lighting system according to the embodiment will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment

Figure 1:
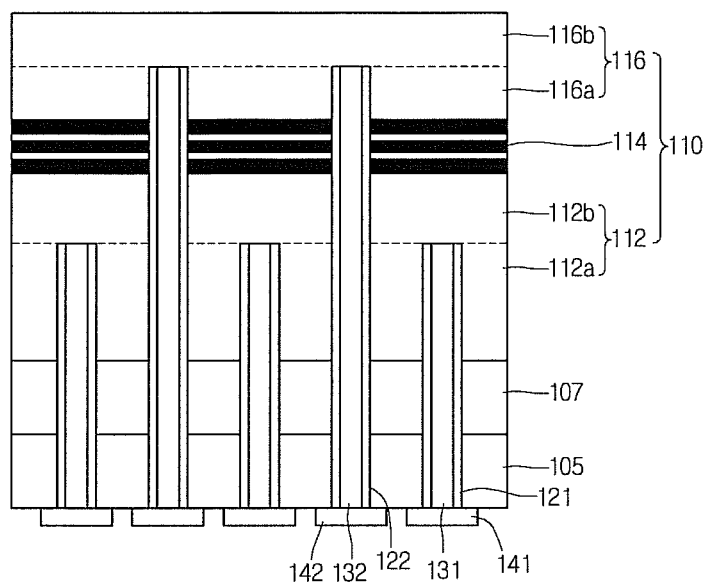
FIG. 1 is a sectional view showing a light emitting device according to the first embodiment.

FIG. 1 is a sectional view showing a light emitting device 100 according to the first embodiment.

The light emitting device 100 according to the first embodiment may include a substrate 105, a first conductive semiconductor layer 112 on the substrate 105, an active layer 114 on the first conductive semiconductor layer 112, a second conductive semiconductor layer 116 on the active layer, a first via electrode 131 to make contact with the first conductive semiconductor layer 112 through a via hole h1 formed through the substrate 105, and a second via electrode 132 to make contact with the second conductive semiconductor layer 116 through a second via hole h2 formed through the substrate 105, the first conductive semiconductor layer 112, and the active layer 114.

The first conductive semiconductor layer 112, the active layer 114, and the second conductive semiconductor layer 114 may constitute a light emitting structure 110 to emit light in the light emitting device 100.

In addition, according to the embodiment, a buffer layer 107 can be interposed between the substrate 105 and the first conductive semiconductor layer 112 to reduce stress caused by the lattice constant difference between the substrate 105 and the light emitting structure 110.

Further, according to the embodiment, a first insulating layer 121 surrounding the lateral side of the first via electrode 131 and a second insulating layer 122 surrounding the lateral side of the second via electrode 132 can be additionally provided to prevent electric short.

Meanwhile, according to a light emitting device packaging technology of the related art, a flip-chip light emitting device is based on a lateral-type light emitting device, and a hole injection semiconductor layer and an active layer are etched to form an N type electrode, thereby exposing an electrode injection layer. In the above process, the active layer 114 is significantly removed, so that the light emission area is narrowed. Accordingly, the luminous flux is reduced.

Therefore, according to the embodiment, the optimal via electrode is applied to the flip-chip light emitting device through a structure completely different from an electrode structure of the flip-chip light emitting device according to the related art, thereby minimizing the removal of an active layer from the flip-chip light emitting device to ensure a light emission area, so that luminous flux can be improved. In addition, the emitted light can be prevented from being shielded or reflected by an electrode to enhance light extraction efficiency.

In addition, according to the embodiment, electrode materials constituting the first and second via electrodes 131 and 132 may include nitride transition metal.

For example, according to the related art, the electrode materials constituting the first and second via electrodes 131 and 132 may include one of CrN, TiN, and CrAlN, but the embodiment is not limited thereto.

According to the embodiment, materials constituting the first and second via electrodes 131 and 132 include nitride transition metal having the melting point of 1500° C. or more. Therefore, in the flip-chip light emitting device, a transition metal material representing high thermal stability is employed for the via electrode material, thereby providing a light emitting device representing high reliability.

For example, according to the embodiment, among the nitride transition metals employed as the via electrode material, CrN represents the melting point of about 1770° C., and TiN represents the melting point of about 2930° C. Accordingly, although an epitaxial process is performed with respect to the light emitting structure after the via electrode has been formed, since the via electrode represents high thermal stability, the light emitting device having high reliability can be provided. Even if a chip operates after the chip has been formed, the light emitting device having high reliability can be provided due to the high thermal stability.

Meanwhile, an electrode employed in the flip-chip light emitting device according to the related art represents a low optical transmittance rate, so that most of light is extracted through a sapphire substrate. Accordingly, light extraction efficiency is lowered.

Therefore, according to the embodiment, materials constituting the first and second via electrodes 131 and 132 may include nitride transition metal representing at least 70% of the optical transmittance rate.

For example, TiN maintains about 80% or more of the optical transmittance rate at the wavelength of 300 nm, and CrAlN maintains about 70% of more of the optical transmittance rate at the wavelength of 250 nm.

Therefore, according to the embodiment, the optimal via electrode is applied to the flip-chip light emitting device, thereby minimizing the removal of an active layer from the flip-chip light emitting device to ensure a light emission area, so that luminous flux can be improved. Further, the flip-chip light emitting device employs an electrode material representing a high optical transmittance rate to enhance the light extraction efficiency.

In addition, since the flip-chip light emitting device according to the related art is based on the lateral-type light emitting device, current concentration is caused to lower light emission efficiency.

Therefore, according to the embodiment, materials constituting the first and second via electrodes 131 and 132 may include nitride transition metal representing high electric conductivity. For example, TiN has electric resistance in the range of about 30 μΩ·cm to 70 μΩ·cm, and CrN has electric resistance in the range of about 25 μΩ·cm, so that the first and second via electrodes 131 and 132 represent superior electric conductivity.

Therefore, according to the embodiment, materials constituting the first and second via electrodes 131 and 132 include nitride transition metal representing high electric conductivity, thereby minimizing the removal of an active layer from the flip-chip light emitting device to ensure a light emission area, so that luminous flux can be improved. In addition, light emission efficiency can be improved through current spreading resulting from the high electric conductivity.

According to the light emitting device 100 of the embodiment, the light emission area is ensured in the flip-chip emitting device to enhance the luminous flux.

In addition, according to the embodiment, in the flip-chip light emitting device, a transition metal material representing high thermal stability is employed for the via electrode material, thereby providing a light emitting device representing high reliability Further, according to the embodiment, in the flip-chip light emitting device, light emission efficiency can be ensured through current spreading.

Besides, according to the embodiment, in the flip-chip light emitting device, the electrode material representing a high optical transmittance rate is employed to enhance the light extraction efficiency.

Hereinafter, the method of manufacturing the light emitting device will be described with reference to FIGS. 2 to 8.

Figure 2:
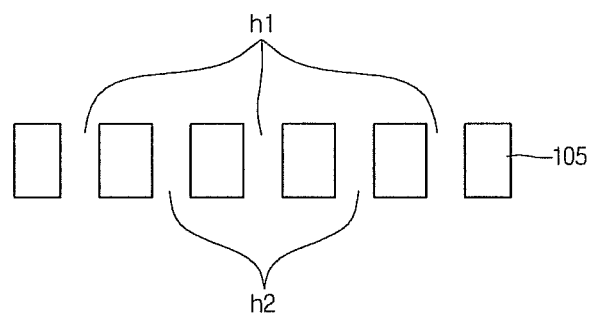
FIGS. 2 to 8 are sectional views showing the manufacturing process in a method of manufacturing a light emitting device according to the first embodiment.

First, as shown in FIG. 2, the substrate 105 is prepared. The substrate 105 may include a material representing superior thermal conductivity. The substrate 105 may include a conductive substrate or an insulating substrate. For example, the substrate 105 may include at least one of sapphire ($Al_2O_3$), SiC, Si, GaAs, GaN, ZnO, GaP, InP, Ge, and $Ga_2O_3$. A concave-convex structure is formed in the substrate 105 to enhance the light extraction efficiency, but the embodiment is not limited thereto.

Thereafter, a plurality of via holes h1 and h2 may be formed in the substrate. For example, the via holes may include the first and second via holes h1 and h2, and at least two via holes may be formed.

The via holes may be formed physically or chemically through a laser drilling process or an etching process for the substrate 105.

Figure 3:
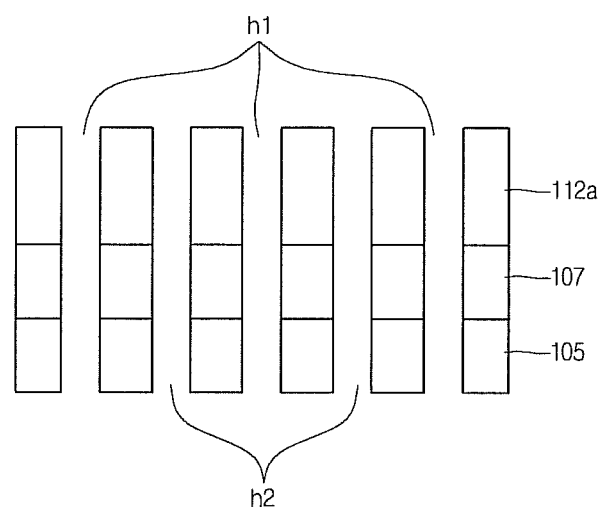

Next, as shown in FIG. 3, the buffer layer 107 and a primary-first conductive semiconductor layer 112a may be formed on the substrate 105 having the via holes formed therein.

The buffer layer 107 and the primary-first conductive semiconductor layer 112a may be selectively formed at a region for the substrate 105. Meanwhile, a first sacrificial layer (not shown) such as a photoresist film may be filled in the via hole to prevent the buffer layer 107 and the primary-first conductive semiconductor layer 112a from being merged while growing, but the embodiment is not limited thereto.

The buffer layer 107 may reduce the lattice mismatch between the light emitting structure 110 and the substrate 105. The materials constituting the buffer layer 107 may include group III-V compound semiconductors. For example, the materials may include at least one of GaN, InN, AlN, InGaN, AlGaN, InAlGaN, and AlInN.

The primary-first conductive semiconductor layer 112a may be realized by using group III-V compound semiconductors doped with first conductive dopants. The primary-first conductive semiconductor layer 112a may include the semiconductor material having the compositional formula of $In_xAl_yGa_{1-x-y}N$ ($0 \leq x \leq 1$, $0 \leq y \leq 1$, $0 \leq x+y \leq 1$). For example, the primary-first conductive semiconductor layer 112a may have a lamination structure of layers including at least one of compound semiconductors such as GaN, InN, AlN, InGaN, AlGaN, InAlGaN, AlInN, AlGaAs, GaP, GaAs, GaAsP, and AlGaInP. The primary-first conductive semiconductor layer 112a may include N type semiconductor layers, and the first conductive dopants may include Si, Ge, Sn, Se, and Te serving as the first conductive dopants.

Figure 4:
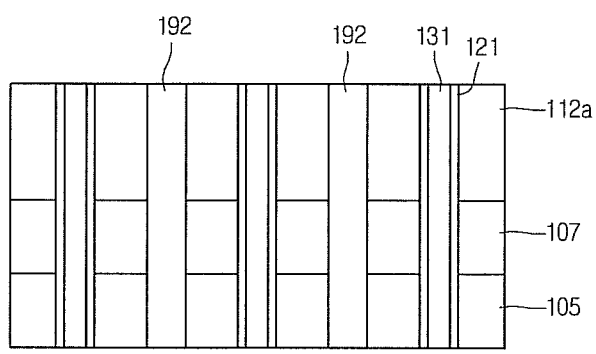

Thereafter, as shown in FIG. 4, the first insulating layer 121 may be formed on the sidewall of the first via hole h1, and the first via electrode 131 may be filled in the first via hole h1. In this case, a second sacrificial layer 192 such as a photoresist film may be filled in the second via hole h2, but the embodiment is not limited thereto.

The first insulating layer 121 may include an electric insulating material such as an oxide or a nitride, and may be formed through a deposition scheme, but the embodiment is not limited thereto.

The first via electrode 131 may include nitride transition metal as an electrode material. For example, the electrode material of the first via electrode 131 may include at least one of CrN, TiN, and CrAlN as an electrode material, but the embodiment is not limited thereto.

According to the embodiment, a material constituting the first via electrode 131 includes nitride transition metal having the melting point of 1500° C., so that the transition metal material representing high thermal stability is employed for the via electrode material, thereby providing the light emitting device having high reliability.

Therefore, according to the embodiment, the material constituting the first via electrode 131 includes nitride transition metal having at least 70% of the optical transmittance, so that the optimal via electrode is applied to the flip-chip light emitting device, thereby minimizing the removal of an active layer from the flip-chip light emitting device to ensure a light emission area. Accordingly, luminous flux can be improved. Further, the electrode material representing a high optical transmittance rate is employed in the flip-chip light emitting device to enhance light extraction efficiency.

Therefore, according to the embodiment, a material constituting the first via electrode 131 includes nitride transition metal representing high electric conductivity, thereby minimizing the removal of an active layer from the flip-chip light emitting device to ensure a light emission area, so that luminous flux can be improved. In addition, light emission efficiency can be improved through current spreading resulting from the high electric conductivity.

Figure 5:
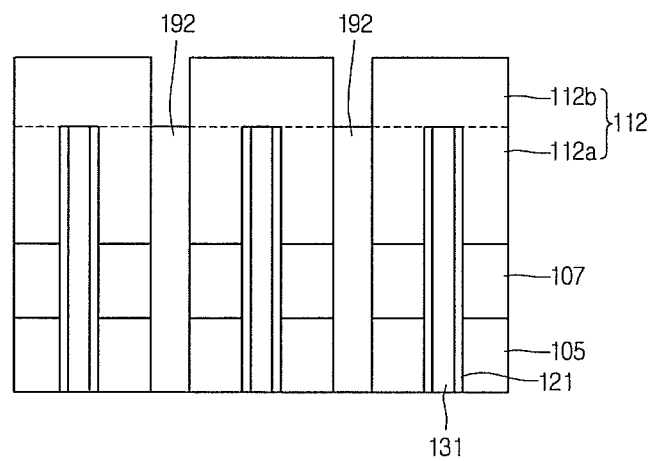

Subsequently, as shown in FIG. 5, a secondary-first conductive semiconductor layer 112b is formed on the primary-first conductive semiconductor layer 112a, so that the top surface of the first via electrode 131 may make contact with the secondary-first conductive semiconductor layer 112b. The primary conductive semiconductor layer 112a and the secondary-first conductive semiconductor layer 112b may constitute the first conductive semiconductor layer 112.

Figure 6:
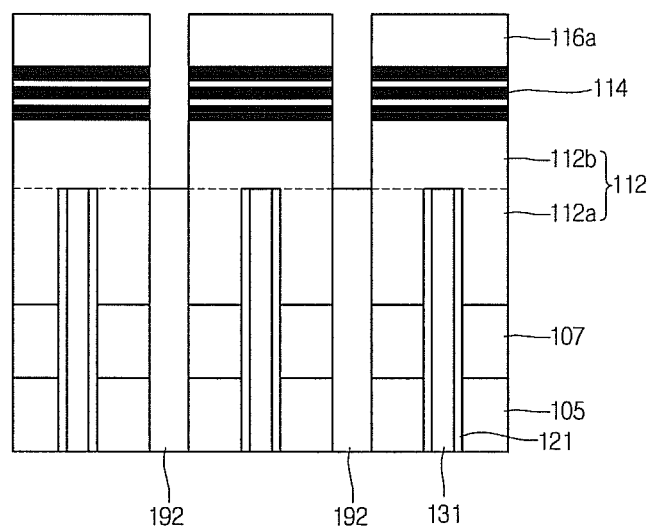

Next, as shown in FIG. 6, the active layer 114 and a primary-second conductive semiconductor layer 115a are formed on the first conductive semiconductor layer 112.

The active layer 114 and the primary-second conductive semiconductor layer 116a are not grown on the second sacrificial layer 192, so that the active layer 114 and the primary-second conductive semiconductor layer 116a may selectively grown on the top surface of the first conductive semiconductor layer 112.

The active layer 114 includes at least one of a single quantum well structure, a multiple quantum well structure, a quantum wire structure, and a quantum dot structure. The active layer 114 has the periodicity of the well layer and the barrier layer. The well layer may have the compositional formula of $In_xAl_yGa_{1-x-y}N$ ($0 \leq x \leq 1$, $0 \leq y \leq 1$, and $0 \leq x+y \leq 1$), and have the compositional formula of $In_xAl_yGa_{1-x-y}N$ ($0 \leq x \leq 1$, $0 \leq y \leq 1$, and $0 \leq x+y \leq 1$). At least one periodicity of the well layer/barrier layer may be formed by using the lamination structure of InGaN/GaN, GaN/AlGaN, InGaN/AlGaN, InGaN/InGaN, and InAlGaN/InAlGaN. The barrier layer may include a semiconductor material having a bandgap higher than a bandgap of the well layer.

The primary-second conductive semiconductor layer 116a includes a semiconductor doped with second conductive dopants. For example, the secondary-second conductive semiconductor layer 116a may have the compositional formula of $In_xAl_yGa_{1-x-y}N$ ($0 \leq x \leq 1$, $0 \leq y \leq 1$, and $0 \leq x+y \leq 1$). The primary-second conductive semiconductor layer 116a may include one of compound semiconductors such as GaN, InN, AlN, InGaN, AlGaN, InAlGaN, AlInN, AlGaAs, GaP, GaAs, GaAsP, and AlGaInP. The primary-second conductive semiconductor layer 116a may include P type semiconductor layers. Primary-second conductive dopants may include Mg, Zn, Ca, Sr, and Ba serving as P type dopants.

Figure 7:
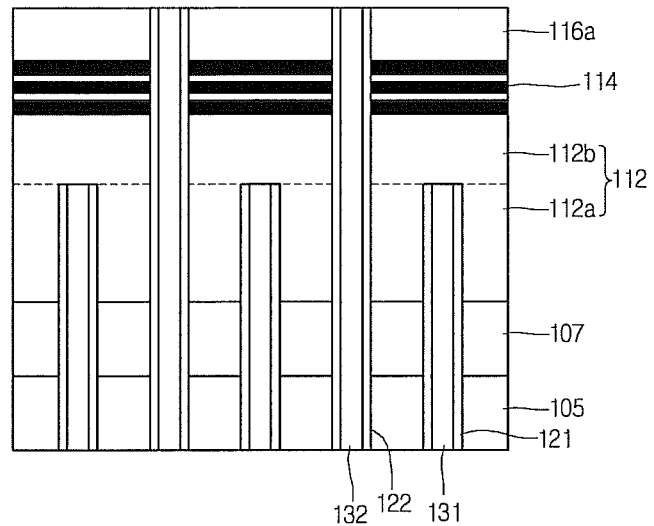

Subsequently, as shown in FIG. 7, the second insulating layer 122 and the second via electrode 132 may be formed in the second via hole h2 after removing the second sacrificial layer 192.

Similarly to the first insulating layer 121, the second insulating layer 122 may include an electric insulating material such as an oxide or a nitride, and may be formed through a deposition scheme, but the embodiment is not limited thereto.

Similarly to the first via electrode 131, the second via electrode 132 may include nitride transition metal. For example, the second via electrode 132 may include at least one of CrN, TiN, and CrAlN serving as an electrode material, but the embodiment is not limited thereto.

According to the embodiment, a material constituting the second via electrode 132 includes nitride transition metal having the melting point of 1500° C., so that the transition metal material representing high thermal stability is employed for the via electrode material in the flip-chip light emitting device, thereby providing the light emitting device having high reliability.

Therefore, according to the embodiment, the material constituting the second via electrode 132 includes nitride transition metal having at least 70% of the optical transmittance, so that the optimal via electrode is applied to the flip-chip light emitting device, thereby minimizing the removal of an active layer from the flip-chip light emitting device to ensure a light emission area. Accordingly, luminous flux can be improved. Further, the electrode material representing a high optical transmittance rate is employed in the flip-chip light emitting device to enhance light extraction efficiency.

Therefore, according to the embodiment, a material constituting the second via electrode 132 includes nitride transition metal representing high electric conductivity to ensure a light emission area in the flip-chip light emitting device, so that luminous flux can be improved. In addition, light emission efficiency can be improved through current spreading resulting from the high electric conductivity.

Figure 8:
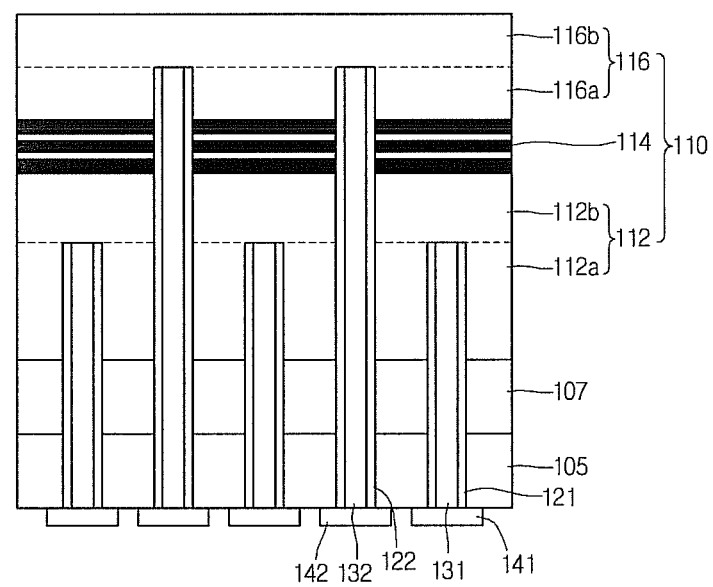

Thereafter, as shown in FIG. 8, a secondary-second conductive semiconductor layer 116b may be formed on the primary-second conductive semiconductor layer 116a, a first electrode 141 may be on the bottom surface of the first via electrode 131, and a second electrode 142 may be formed on the bottom surface of the second via electrode 132.

The primary-second conductive semiconductor layer 116a and the secondary-second conductive semiconductor layer 116b may constitute the second conductive semiconductor layer 116.

The first electrode 141 and the second electrode 142 may include an ohmic layer (not shown), a reflective layer (not shown), or a combined layer (not shown), but the embodiment is not limited thereto.

According to the embodiment, the light emitting structure 110 may include opposite dopants. For example, the first conductive semiconductor layer 112 may include a P type semiconductor layer, and the second conductive semiconductor layer 116 may include an N type semiconductor layer. The second conductive semiconductor layer 116 may be provided thereon with a first conductive semiconductor layer (not shown) having a polarity opposite to the second conductive polarity.

The light emitting structure 110 may have one of an N-P junction structure, a P-N junction structure, an N-P-N junction structure, and a P-N-P junction structure. In this case, the alphabet "P" represents a P type semiconductor layer, the alphabet "N" represents an N type semiconductor layer, and the sign "–" represents that the P type semiconductor layer directly or indirectly makes contact with the N type semiconductor layer.

According to the light emitting device and the method of manufacturing the same of the embodiment, the light emission are can be ensured in the flip-chip light emitting device, so that the luminous flux can be improved.

In addition, according to the embodiment, in the flip-chip light emitting device, the transition metal material representing high thermal stability is employed, so that the light emitting device representing high reliability can be provided.

Further, according to the embodiment, in the flip-chip light emitting device, the light emission efficiency can be improved through current spreading.

In addition, according to the embodiment, an electrode material representing a high optical transmittance rate is employed in the flip-chip light emitting device to enhance light extraction efficiency.

Figure 9:
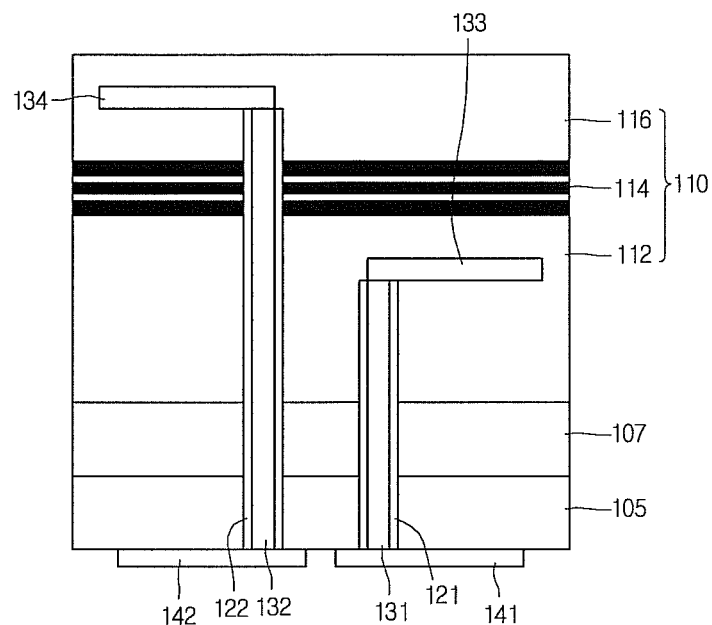
FIG. 9 is a sectional view showing a light emitting device according to the second embodiment.

FIG. 9 is a sectional view showing a light emit device 102 according to the second embodiment.

The second embodiment may employ technical features of the first embodiment. The following description will be made while focusing on the additional feature of the second embodiment.

The second embodiment may further include a first extending electrode 133 extending in a lateral direction of the first via electrode 131 while making contact with the top surface of the first via electrode 131.

In addition, the second embodiment may further include a second extending electrode 134 extending in the lateral direction of the second via electrode 132 while making contact with the top surface of the second via electrode 132.

The first extending electrode 133 or the second extending electrode 134 may extend in the lateral direction of the first via electrode 131 or the second via electrode 132, but the embodiment is not limited thereto.

Since the flip-chip light emitting device according to the related art is based on a lateral-type light emitting device, current concentration is caused to lower the light emission efficiency. In addition, the electrode employed in the flip-chip light emitting device according to the related art represents a low optical transmittance rate, so that most light is extracted through the sapphire substrate to lower the light extraction efficiency.

Therefore, according to the embodiment, the first extending electrode 133 or the second extending electrode 134 extending in the lateral direction from one of the first vial electrode 131 and the second via electrode 132 is provided, thereby remarkably enhancing the light emission efficiency by increasing the carrier injection efficiency through the current spreading.

In particular, according to the second embodiment, the removal of an active layer region is minimized by minimizing a via electrode, thereby increasing the light emission area, so that the internal light emission efficiency can be enhanced. In addition, if the above lateral extending electrode is provided in a hole injection semiconductor layer, into which holes are injected, for example, the second conductive semiconductor layer 116, the lateral extending electrode accelerates the spreading of hole carriers to enhance carrier injection efficiency, so that the increase of the light efficiency can be optimized.

Further, according to the embodiment, similarly to the material constituting the via electrode, the lateral extending electrode includes a material representing a high optical transmittance rate to contribute to the external light extraction efficiency of the emitted light, thereby more enhancing the whole light emission efficiency of the light emitting device chip.

Figure 10:
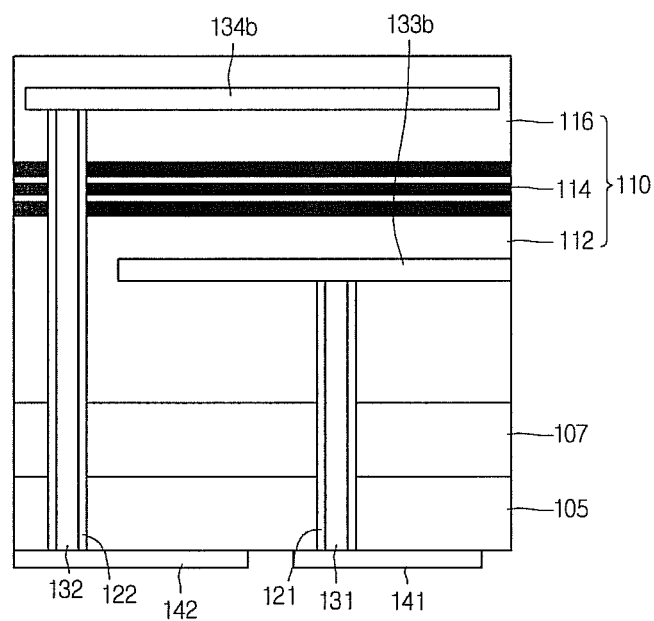
FIG. 10 is a sectional view showing a light emitting device according to the third embodiment.

FIG. 10 is a sectional view showing a light emitting device 103 according to the third embodiment.

The third embodiment may employ technical features of the first and second embodiments. The following description will be made while focusing on the additional feature of the third embodiment.

According to the third embodiment, a first extending electrode 133*b* or a second extending electrode 134*b* extends in both lateral directions from the first via electrode 131 or the second via electrode 132 to more contribute to current spreading, so that the light emission efficiency can be enhanced.

Therefore, according to the third embodiment, the light emission area is widened by minimizing the number of via electrodes to enhance the internal light emission efficiency, and the spreading of carriers in bi-directions of the via electrodes is more accelerated, so that carrier injection efficiency can be enhanced to optimize the enhancement of the light efficiency.

According to the light emitting device and the method of manufacturing the same of the embodiment, the light emission area is ensured in the flip-chip light emitting device so that the luminous flux can be enhanced.

In addition, in the flip-chip light emitting device, a transition metal material representing high thermal stability is employed for the via electrode material, thereby providing a light emitting device representing high reliability.

Further, according to the embodiment, in the flip-chip light emitting device, light emission efficiency can be ensured through current spreading.

Besides, the flip-chip light emitting device employs an electrode material representing a high optical transmittance rate to enhance light extraction efficiency.

Figure 11:
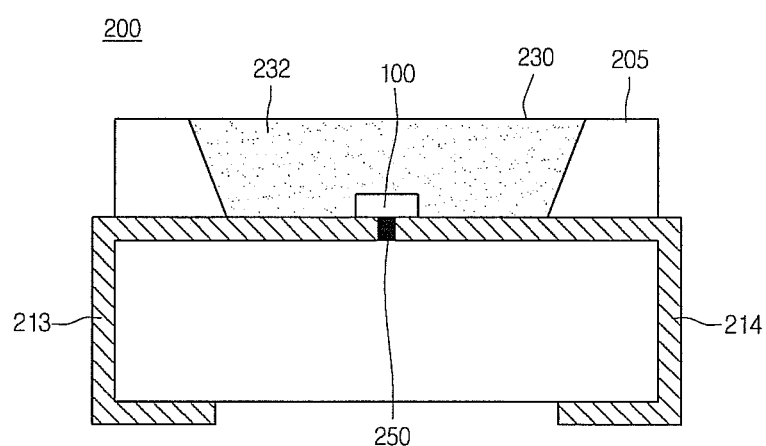
FIG. 11 is a view showing a light emitting device package 200.

FIG. 11 is a view showing a light emitting device package 200 in which a light emitting device according to the embodiments is installed.

The light emitting device package 200 according to the embodiment includes a package body 205, third and second lead electrodes 213 and 214 formed on the package body 205, the light emitting device 100 according to the embodiment, which is installed in the package body 205 and electrically connected to the third and second lead electrodes 213 and 214, and a molding member 230 surrounding the light emitting device 100.

The package body 205 may include silicon, synthetic resin, or metallic material. An inclined surface may be formed around the light emitting device 100.

The third and fourth lead electrodes 213 and 214 are electrically insulated from each other and supply power to the light emitting device 100. The third and second lead electrodes 213 and 214 may reflect light emitted from the light emitting device 100 to increase light efficiency, and may dissipate heat generated from the light emitting device 100 to the outside.

The light emitting device 100 may include a light emitting device shown in FIG. 1 or 10, but the embodiment is not limited thereto.

The light emitting device 100 may be mounted on the package body 205 or on the third lead electrode 213 or the fourth lead electrode 214.

The light emitting device 100 may be electrically connected with the third lead electrode 213 and/or the fourth lead electrode 214 through a flip chip scheme. For example, the first electrode 141 may be connected to the third lead electrode 213 and the second electrode 142 may be connected to the fourth lead electrode 214. And a insulating member 250 may be disposed between the third lead electrode 213 and the fourth lead electrode 214.

The molding member 230 may protect the light emitting device 100 by surrounding the light emitting device 100. In addition, the molding member 230 may include phosphors (232) to change the wavelength of light emitted from the light emitting device 100.

Figure 12:
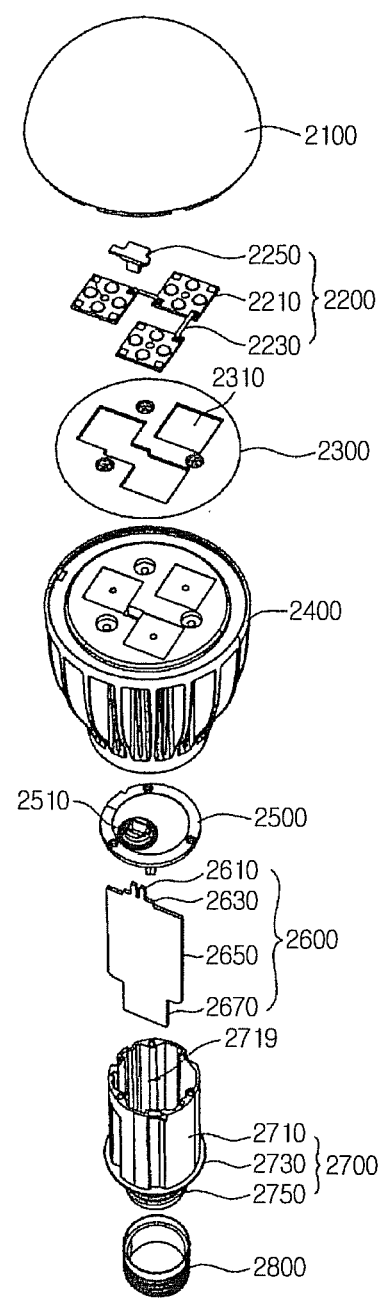
FIG. 12 is exploded perspective views showing examples of a lighting system including a light emitting device according to the embodiment.

FIG. 12 is exploded perspective views showing examples of a lighting system including a light emitting device according to the embodiment.

As shown in FIG. 12, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 3100 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion 2610 of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

The embodiment provides a light emitting device, a method of manufacturing the same, a light emitting device package, and a lighting system, in which luminous flux can be improved by ensuring a light emission area in a flip-chip light emitting device.

The embodiment provides a light emitting device, a method of manufacturing the same, a light emitting device package, and a lighting system, in which light emission efficiency can be ensured through current spreading in a flip-chip light emitting device.

The embodiment provides a light emitting device, a method of manufacturing the same, a light emitting device package, and a lighting system, in which light extraction efficiency can be enhanced by employing an electrode material representing a high optical transmittance rate in a flip-chip light emitting device.

According to the embodiment, there is provided a light emitting device including a substrate; a first conductive semiconductor layer disposed on the substrate; an active layer disposed on the first conductive semiconductor layer; a second conductive semiconductor layer disposed on the active layer; a first via electrode contacted with the first conductive semiconductor layer through a via hole penetrating the substrate; and a second via electrode contacted with the second conductive semiconductor layer through a second via hole penetrating the substrate, the first conductive semiconductor layer, and the active layer.

According to the embodiment, there is provided a light emitting device including a substrate, a first conductive semiconductor layer, an active layer, and a second conductive semiconductor layer laminated on the substrate, a first via electrode to make contact with the bottom surface of the first conductive semiconductor layer through a via hole formed through the substrate from the bottom surface of the substrate, a second via electrode to make contact with the bottom surface of the second conductive semiconductor layer through a second via hole formed through the substrate, the first conductive semiconductor layer, and the active layer from the bottom surface of the substrate, a first extending electrode extending from the first via electrode while making contact with the top surface of the first via electrode, and a second extending electrode extending from the second via electrode while making contact with the top surface of the second via electrode.

According to the light emitting device, the method of manufacturing the same, the light emitting device package, and the lighting system of the embodiment, luminous flux can be improved by ensuring the light emission area in the flip-chip light emitting device.

In addition, according to the embodiment, in the flip-chip light emitting device, a transition metal material representing high thermal stability is employed for the via electrode material, thereby providing the light emitting device representing high reliability.

Further, according to the embodiment, in the flip-chip light emitting device, light emission efficiency can be ensured through current spreading.

In addition, according to the embodiment, in the flip-chip light emitting device, light extraction efficiency can be enhanced by employing an electrode material representing a high optical transmittance rate.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device comprising:
a substrate;
a first conductive semiconductor layer disposed on the substrate;
an active layer disposed on the first conductive semiconductor layer;
a second conductive semiconductor layer disposed on the active layer;
a first via electrode contacting the first conductive semiconductor layer through a via hole penetrating the substrate;
a second via electrode contacting the second conductive semiconductor layer through a second via hole penetrating the substrate, the first conductive semiconductor layer, and the active layer;
a first extending electrode extending from the first via electrode while contacting a top surface of the first via electrode;
a second extending electrode extending from the second via electrode while contacting a top surface of the second via electrode;
a first electrode under a bottom portion of the first via electrode; and
a second electrode under a bottom portion of the second via electrode, wherein the first extending electrode includes a metal material, and
wherein a lateral width of the first extending electrode is greater than a lateral width of the first electrode,
wherein the first extending electrode is disposed in the first conductive semiconductor layer,
wherein a top surface of the first extending electrode is not exposed,
wherein a lateral width of the second extending electrode is greater than a lateral width of the second electrode,
wherein the second extending electrode is disposed in the second conductive semiconductor layer,
wherein a top surface of the second extending electrode is not exposed through an upper surface of the second conductive semiconductor layer,
wherein the second extending electrode is vertically overlapped with the first extending electrode,
wherein the top surface of the second extending electrode is lower than the upper surface of the second conductive semiconductor layer, and
wherein the second extending electrode is not in contact with the upper surface of the second conductive semiconductor layer, and the second extending electrode is not in contact with a lower surface of the second conductive semiconductor layer.

2. The light emitting device of claim 1, further comprising a first insulating layer surrounding a lateral side of the first via electrode.

3. The light emitting device of claim 1, wherein the first via electrode comprises a nitride transition metal.

4. The light emitting device of claim 3, wherein the first via electrode comprises at least one of CrN, TiN, or CrAlN.

5. The light emitting device of claim 3, wherein the first via electrode comprises a nitride transition metal representing a melting point of 1500° C. or more.

6. The light emitting device of claim 3, wherein the first via electrode comprises a nitride transition metal representing at least 70% of an optical transmittance rate.

7. The light emitting device of claim 3, wherein the first via electrode comprises a nitride transition metal representing electric resistance of 70 $\mu\Omega\cdot cm$ or less.

8. The light emitting device of claim 1, further comprising a second insulating layer surrounding a lateral side of the second via electrode.

9. The light emitting device of claim 1, wherein the second via electrode comprises a nitride transition metal.

10. The light emitting device of claim 9, wherein the second via electrode comprises at least one of CrN, TiN, or CrAlN.

11. The light emitting device of claim 9, wherein the second via electrode comprises a nitride transition metal representing a melting point of 1500° C. or more.

12. The light emitting device of claim 9, wherein the second via electrode comprises a nitride transition metal representing at least 70% of an optical transmittance rate.

13. The light emitting device of claim 9, wherein the second via electrode comprises a nitride transition metal representing electric resistance of 70 $\mu\Omega\cdot cm$ or less.

14. The light emitting device of claim 1, wherein the second extending electrode extends in one lateral direction of the second via electrode.

15. The light emitting device of claim 1, wherein the second extending electrode extends in both lateral directions of the second via electrode.

16. The light emitting device of claim 1, wherein a maximum width of the first extending electrode is less than a maximum width of the substrate.

17. The light emitting device of claim 1, wherein the first extending electrode is vertically overlapped with the second extending electrode.

18. A light emitting device comprising:
a substrate;
a first conductive semiconductor layer, an active layer and a second conductive semiconductor layer disposed on the substrate;
a first via electrode contacting a bottom surface of the first conductive semiconductor layer through a via hole penetrating the substrate from a bottom surface of the substrate;
a second via electrode contacting a bottom surface of the second conductive semiconductor layer through a second via hole penetrating the substrate, the first conductive semiconductor layer, and the active layer from the bottom surface of the substrate;
a first extending electrode extending from the first via electrode while contacting a top surface of the first via electrode;
a second extending electrode extending from the second via electrode while contacting a top surface of the second via electrode;
a first electrode under a bottom portion of the first via electrode; and
a second electrode under a bottom portion of the second via electrode, wherein the first extending electrode includes a metal material, and
wherein a lateral width of the first extending electrode is greater than a lateral width of the first electrode,
wherein the first extending electrode is disposed in the first conductive semiconductor layer, and
wherein a top surface of the first extending electrode is not exposed,
wherein a lateral width of the second extending electrode is greater than a lateral width of the second electrode,
wherein the second extending electrode is disposed in the second conductive semiconductor layer,
wherein a top surface of the second extending electrode is not exposed through an upper surface of the second conductive semiconductor layer,
wherein the second extending electrode is vertically overlapped with the first extending electrode,
wherein the top surface of the second extending electrode is lower than the upper surface of the second conductive semiconductor layer, and
wherein the second extending electrode is not in contact with the upper surface of the second conductive semiconductor layer, and the second extending electrode is not in contact with a lower surface of the second conductive semiconductor layer.

19. The light emitting device of claim 18,
wherein the second extending electrode extends in one lateral direction of the second via electrode.

20. The light emitting device of claim 18, wherein the second extending electrode extends in both lateral directions of the second via electrode,
wherein a maximum width of the second extending electrode is less than a maximum width of the substrate.

* * * * *